United States Patent
Kang

(10) Patent No.: US 7,335,394 B2
(45) Date of Patent: Feb. 26, 2008

(54) SUBSTRATE SUPPORTING FRAME

(75) Inventor: Tae-Min Kang, Suwon-si (KR)

(73) Assignee: Samsung SDI Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/703,757

(22) Filed: Feb. 8, 2007

(65) Prior Publication Data

US 2007/0148828 A1   Jun. 28, 2007

Related U.S. Application Data

(62) Division of application No. 11/249,514, filed on Oct. 14, 2005, now Pat. No. 7,198,819.

(30) Foreign Application Priority Data

Oct. 19, 2004   (KR) ................................ 2004-83757

(51) Int. Cl.
*B41M 3/12*   (2006.01)

(52) U.S. Cl. .................. 427/148; 427/146; 428/32.77; 430/199; 347/245; 347/257; 347/263; 414/222.01; 118/728; 118/729

(58) Field of Classification Search ................ 427/148; 428/32.77; 430/199; 347/245, 257, 263; 414/222.01; 118/728, 729
See application file for complete search history.

(56) References Cited

U.S. PATENT DOCUMENTS

| | | | |
|---|---|---|---|
| 5,998,085 A | 12/1999 | Isberg et al. | |
| 6,114,088 A | 9/2000 | Wolk et al. | |
| 6,214,520 B1 | 4/2001 | Wolk et al. | |
| 6,777,025 B2 * | 8/2004 | Bedzyk | ...................... 427/171 |
| 6,835,961 B2 * | 12/2004 | Fukayama | .................... 257/84 |
| 2005/0242341 A1 | 11/2005 | Knudson et al. | |

* cited by examiner

*Primary Examiner*—Minhloan Tran
*Assistant Examiner*—Eduardo A. Rodela
(74) *Attorney, Agent, or Firm*—Robert E. Bushnell, Esq.

(57) ABSTRACT

A substrate supporting frame, a substrate supporting frame assembly including the frame, a method of framing a substrate using the frame, a method of fabricating a donor substrate using the substrate supporting frame assembly, and a method of fabricating an Organic Light Emitting Display (OLED) using the donor substrate each include a substrate supporting frame having a main body having an opening, a plurality of pins protruding from at least two sides of a top surface of the main body, and outer pressing units for respectively pressing the plurality of pins outward from the main body.

15 Claims, 10 Drawing Sheets

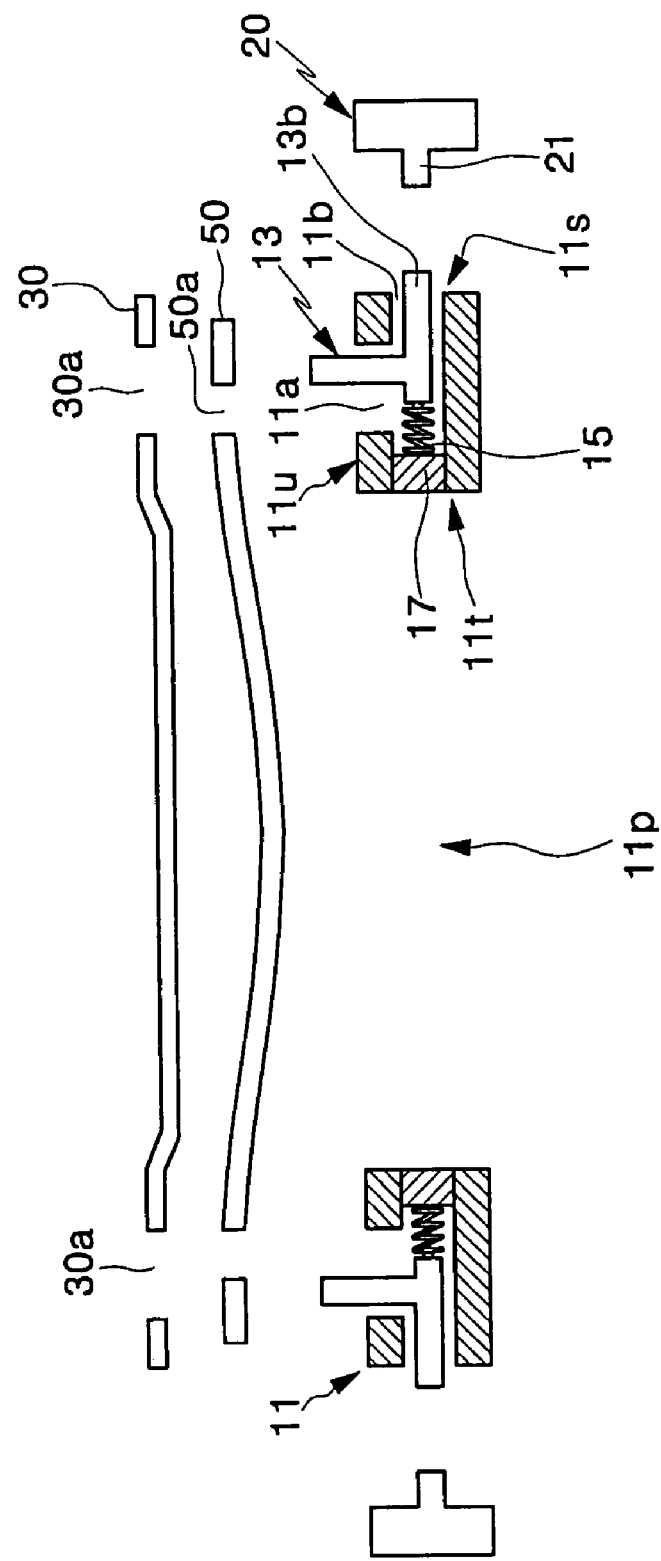

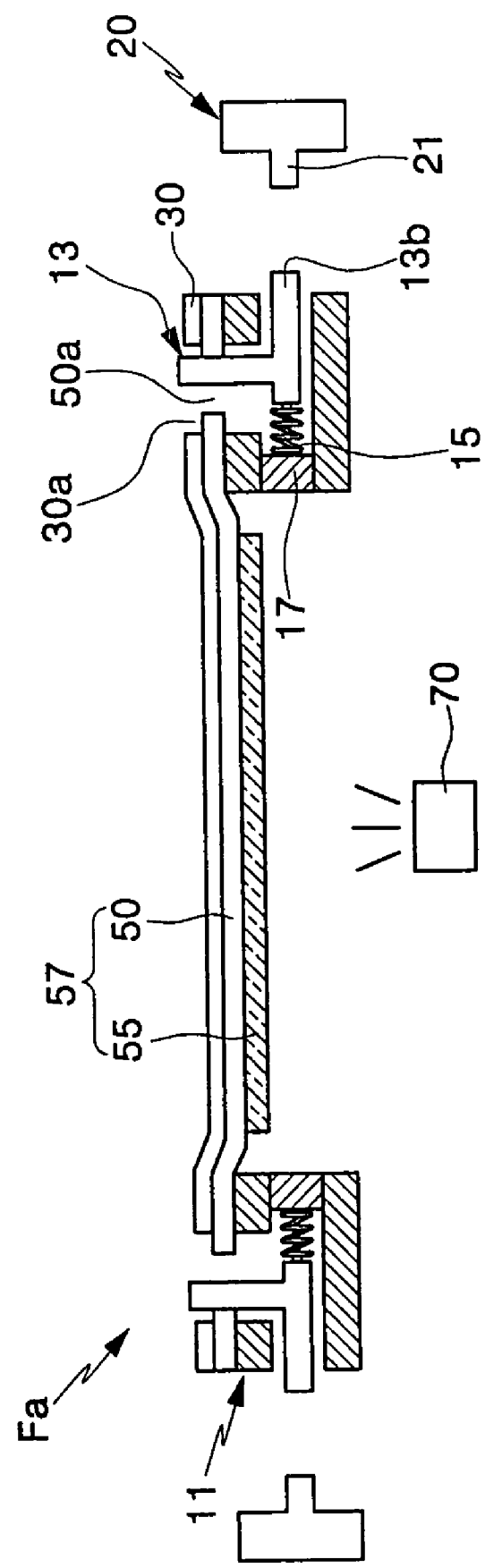

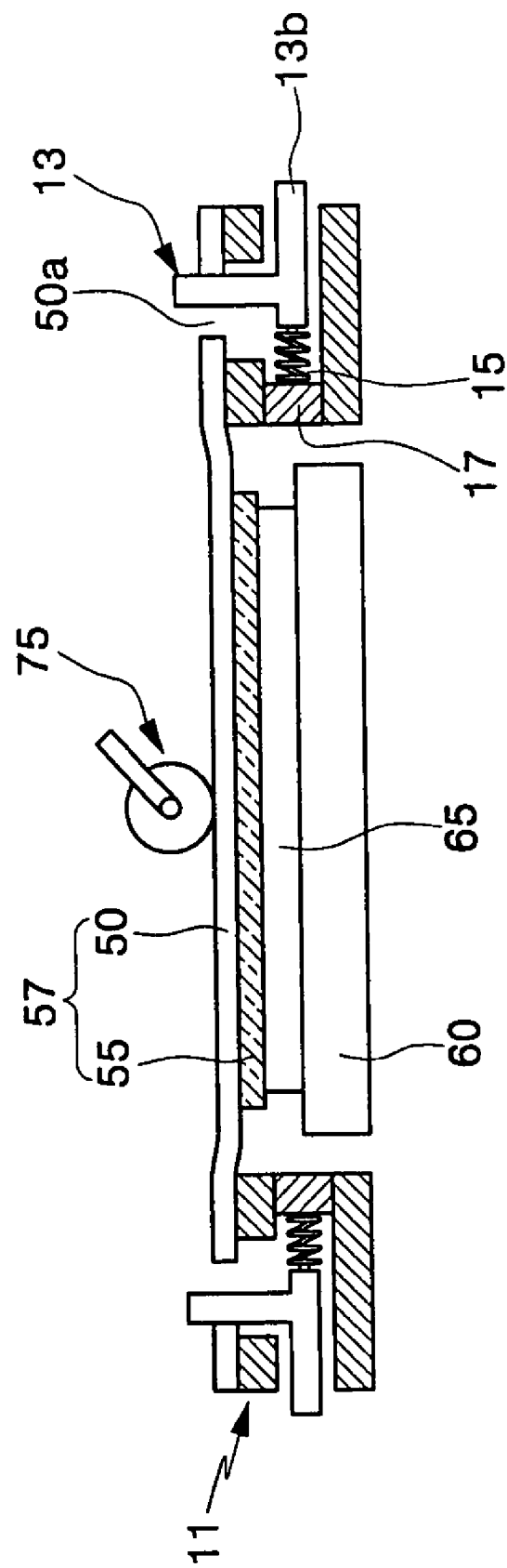

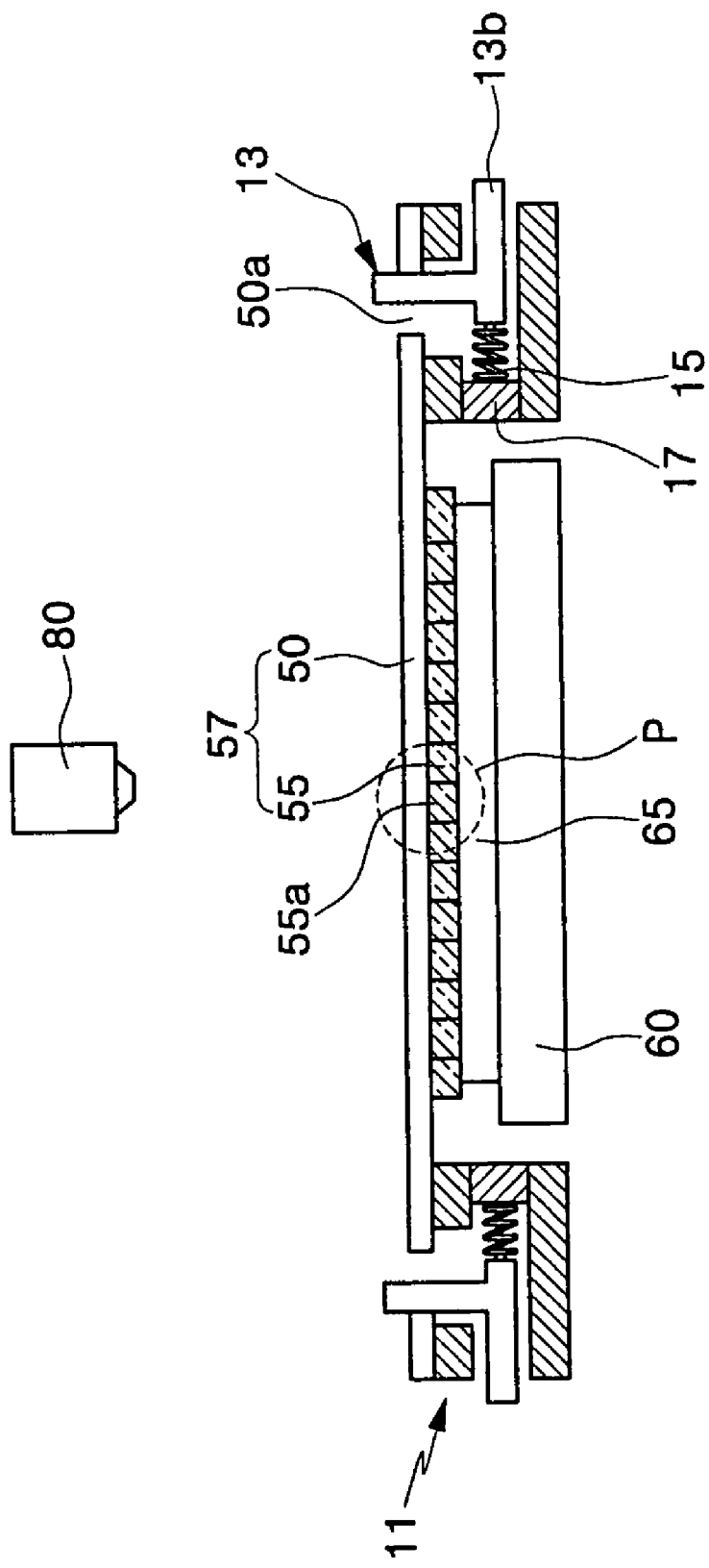

SUBSTRATE SUPPORTING FRAME

CLAIM OF PRIORITY AND CROSS-REFERENCE TO RELATED APPLICATION

This application makes reference to, incorporates the same herein, and claims all benefits accruing under 35 U.S.C. § 119 from an application for SUBSTRATE SUPPORTING FRAME, SUBSTRATE SUPPORTING FRAME ASSEMBLY INCLUDING THE FRAME, METHOD OF FRAMING SUBSTRATE USING THE FRAME, METHOD OF FABRICATING. DONOR SUBSTRATE USING THE FRAME ASSEMBLY, AND METHOD OF FABRICATING OLED USING THE DONOR SUBSTRATE earlier filed in the Korean Intellectual Property Office on the 19 of Oct., 2004 and there duly assigned Serial No. 2004-83757. Furthermore, this application is a divisional of Applicants' Ser. No. 11/249,514 filed in the U.S. Patent & Trademark Office on 14 Oct. 2005, now U.S. Pat. No. 7,198,819, and assigned to the assignee of the present invention.

BACKGROUND OF THE INVENTION

1. Field of the Invention

The present invention relates to a substrate supporting frame and, more particularly, to a substrate supporting frame by which a substrate is stretched taut and framed, a substrate supporting frame assembly including the frame, a method of framing the substrate using the frame, a method of fabricating a donor substrate for a Laser Induced Thermal Imaging (LITI) process using the substrate supporting frame assembly, and a method of fabricating an Organic Light Emitting Display (OLED) using the donor substrate.

2. Description of the Related Art

In general, a Laser Induced Thermal Imaging (LITI) process requires at least a laser, an acceptor substrate, and a donor substrate, and the donor substrate includes a base substrate, a Light-to-Heat Conversion (LTHC) layer, and a transfer layer. The donor substrate is laminated on the acceptor substrate such that the transfer layer faces the acceptor substrate, and laser beams are irradiated onto the base substrate. The beams irradiated onto the base substrate are absorbed by the LTHC layer and converted into thermal energy, and the transfer layer is transferred onto the acceptor substrate due to the thermal energy. As a result, a transfer layer pattern is formed on the acceptor substrate. Examples of the above-described LITI process are disclosed in U.S. Pat. Nos. 5,998,085, 6,214,520, and 6,114,088.

The donor substrate can be fabricated by forming the LTHC layer on the base substrate and forming the transfer layer on the LTHC layer. Since the transfer layer is formed using a thermal evaporation process, the base substrate is often thermally deformed during the formation of the transfer layer. When the base substrate is thermally deformed, the transfer layer is usually non-uniform. Due to this non-uniform transfer layer, a transfer layer pattern is also often non-uniformly formed on the acceptor substrate. When the acceptor substrate is a substrate for an organic light emitting device, the non-uniform transfer layer pattern reduces the organic light emitting device quality.

SUMMARY OF THE INVENTION

The present invention, therefore, provides a substrate supporting frame, which enables the formation of a uniform transfer layer, a substrate supporting frame assembly including the frame, and a method of framing the substrate.

In addition, the present invention provides a method of fabricating a donor substrate using the substrate supporting frame assembly and a method of fabricating an Organic Light Emitting Display (OLED) using the donor substrate.

In an exemplary embodiment of the present invention, a substrate supporting frame includes: a main body having an opening; a plurality of pins protruding from at least two sides of a top surface of the main body; and outer pressing units for respectively pressing the pins outward of the main body.

In another exemplary embodiment of the present invention, a substrate supporting frame assembly includes: the above-described substrate supporting frame; and a substrate disposed on the main body and including substrate holes respectively corresponding to the pins. The pins are inserted into the substrate holes so that the substrate is stretched taut.

In yet another exemplary embodiment of the present invention, a method of framing a substrate includes preparing the above-described substrate supporting frame. A substrate, which includes substrate holes respectively corresponding to the pins, is disposed on the main body. The pins are respectively inserted into the substrate holes. The pins are then respectively pressed by the outer pressing units.

In still another exemplary embodiment of the present invention, a method of fabricating a donor substrate includes preparing the above-described substrate supporting frame. A substrate, which includes substrate holes respectively corresponding to the pins and a Light-to-Heat Conversion (LTHC) layer, is disposed on the main body. The pins are respectively inserted into the substrate holes. The substrate is framed by respectively pressing the pins with the outer pressing units. A transfer layer is then formed on the LTHC layer of the framed substrate.

In another further exemplary embodiment of the present invention, a method of fabricating an OLED includes fabricating the above-described donor substrate. The donor substrate is disposed on an acceptor substrate including at least a pixel electrode such that the transfer layer faces the acceptor substrate. Laser beams are irradiated onto the donor substrate such that at least a portion of the transfer layer is transferred onto the pixel electrode, thereby forming a transfer layer pattern.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein:

FIGS. 3A, 3B, 3C and 3D are cross-sectional views taken along line I-I' of FIG. 2, of a method of framing a substrate according to an exemplary embodiment of the present invention;

FIGS. 4A, 4B and 4C are cross-sectional views of a method of fabricating a donor substrate and a method of fabricating an Organic Light Emitting Display (OLED)

using the donor substrate according to an exemplary embodiment of the present invention.

DETAILED DESCRIPTION OF THE INVENTION

Figure 1:
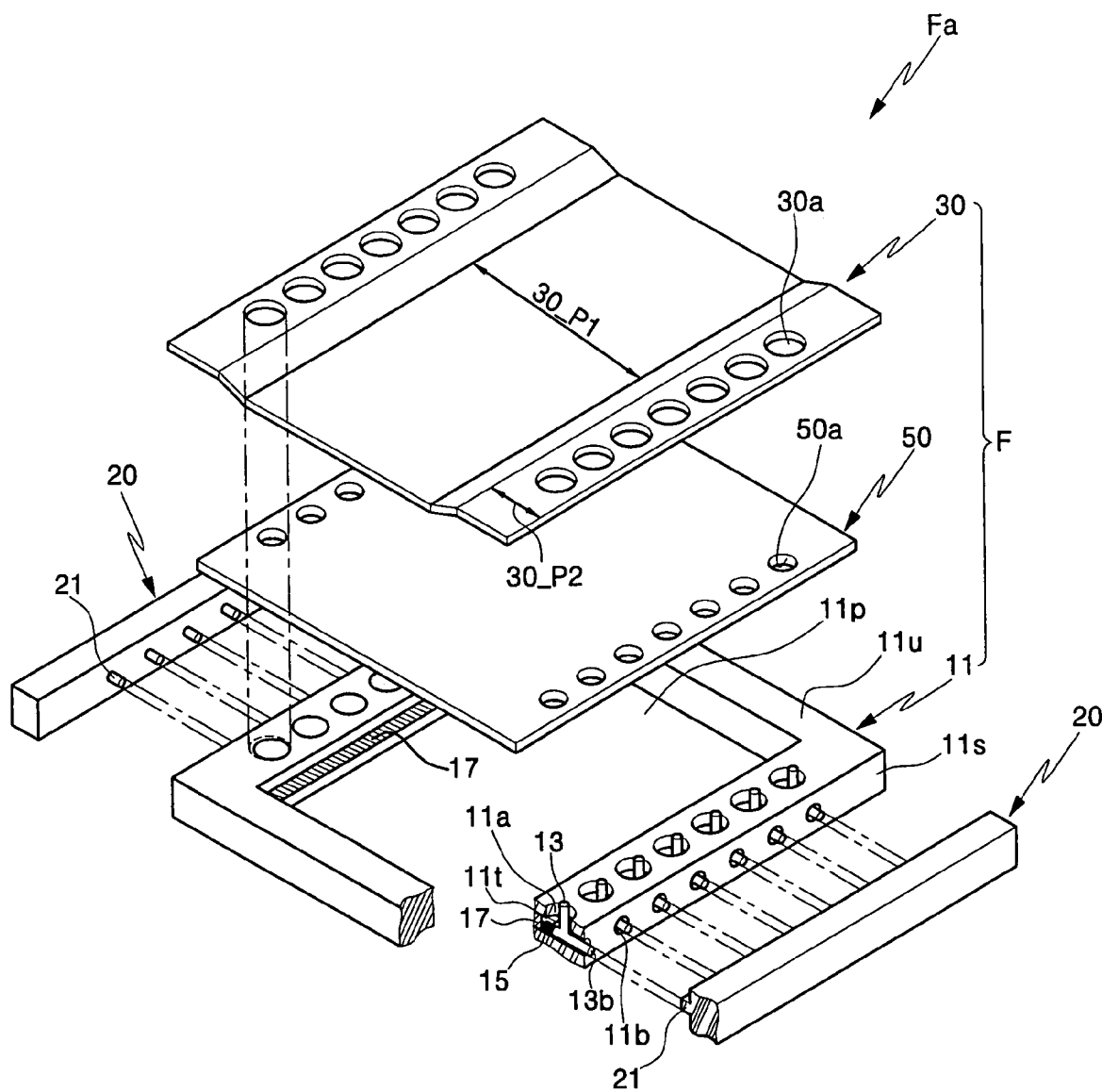
FIG. 1 is an exploded perspective view of a substrate supporting frame and a substrate supporting frame assembly including the frame according to an exemplary embodiment of the present invention.

The present invention is described more fully hereinafter with reference to the accompanying drawings, in which exemplary embodiments of the present invention are shown. This invention can, however, be embodied in different forms and should not be construed as being limited to the embodiments set forth herein. It will also be understood that when a layer is referred to as being "on" another layer or substrate, it can be directly on the other layer or substrate or intervening layers can also be present. The same reference numerals are used to denote the same elements throughout the specification.

Figure 2:
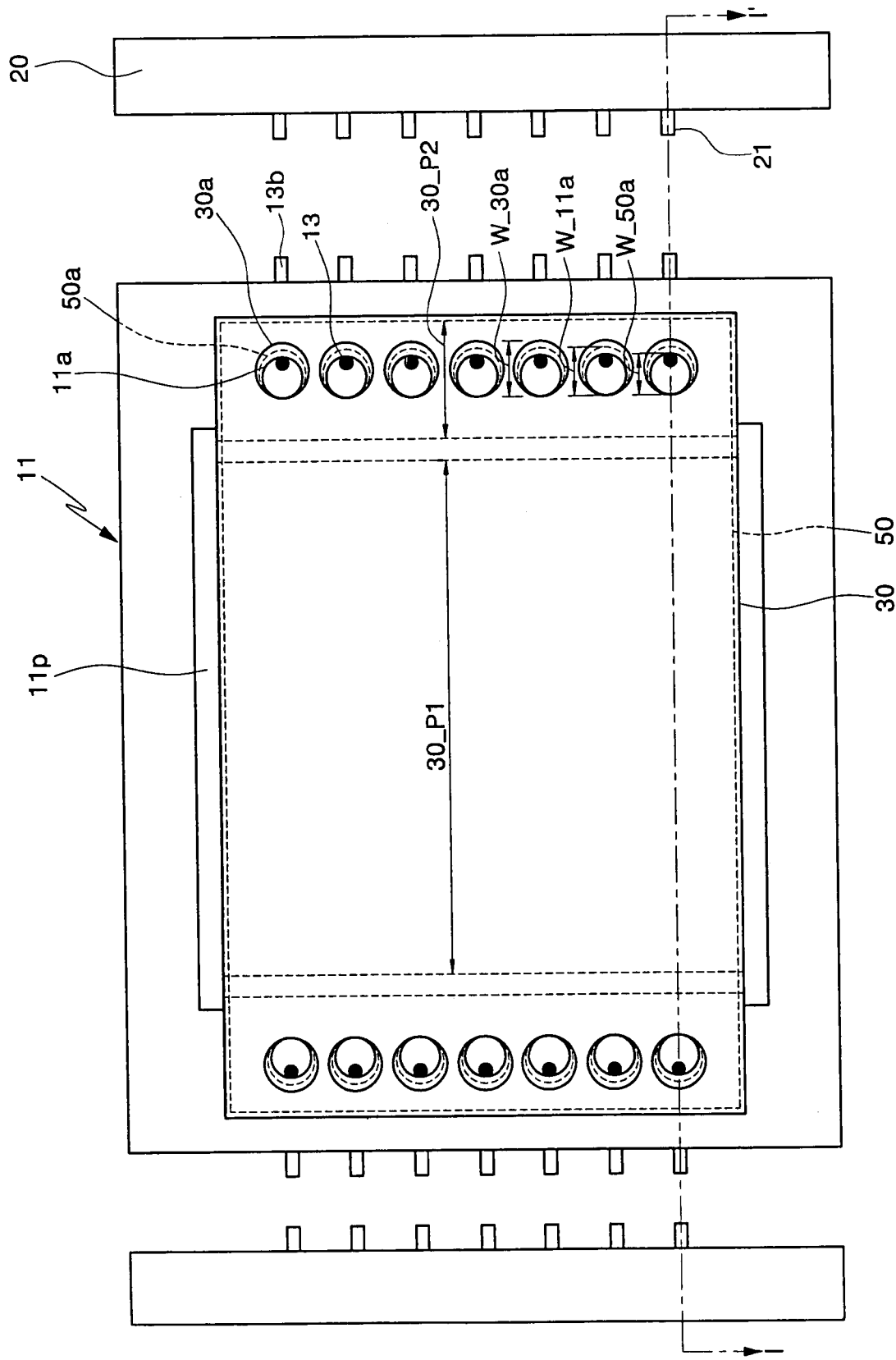
FIG. 2 is a plan view of the substrate supporting frame assembly of FIG. 1.

FIG. 1 is an exploded perspective view of a substrate supporting frame "F" and a substrate supporting frame assembly "Fa" including the frame "F" according to an exemplary embodiment of the present invention, FIG. 2 is a plan view of the substrate supporting frame assembly "Fa" of FIG. 1, and FIGS. 3A, 3B, 3C and 3D are cross-sectional views taken along line I-I' of FIG. 2, which illustrate a method of framing a substrate according to an exemplary embodiment of the present invention.

Referring to FIGS. 1, 2, and 3A, the substrate supporting frame "F" includes a frame main body 11 having an opening 11p. Although the frame main body 11 is illustrated in the drawings as having a rectangular shape, the present invention is not limited thereto and the frame main body 11 can have other various polygonal or circular shapes. The frame main body 11 includes a top surface 11u, a bottom surface (not shown) disposed on the reverse side of the top surface 11u, and outer side surfaces 11s and inner side surfaces 11t, which connect the top surface 11u and the bottom surface.

A plurality of pins 13 protrude from at least two sides of the top surface 11u. The two sides of the top surface 11u face each other. Also, the pins 13 are disposed in an array on each side of the top surface 11u. The pins 13 arrayed on each side of the top surface 11u can be spaced 2 to 10 cm apart from each other. The pins 13 are pressed outward of the frame main body 11 by outer pressing units 15. The substrate supporting frame "F" includes the pins 13 and the outer pressing units 15 along with the frame main body 11.

The frame main body 11 includes top holes 11a formed in the top surface 11u. The pins 13 are disposed in the top holes 11a. Also, each of the outer pressing units 15 can be a spring, which can press the pins 13 using elastic energy. One end of the spring 15 is attached to one of inner sidewalls of the top hole 11a, which corresponds to the inner side surface 11t of the frame main body 11, and the other end of the spring 15 is attached to the pins 13. Thus, by using this frame "F" with the comparatively simple construction, a substrate can be framed as described later. Even if no external force is applied to the pins 13, the pins 13 are disposed outward in the top hole 11a due to the spring 15.

Also, the frame main body 11 further includes side holes 11b, which are formed in the outer side surface 11s and respectively connected to the top holes 11a in the frame main body 11. Furthermore, each of the pins 13 further includes a lateral protrusion 13b that protrudes through the side hole 11b in a lateral direction of the frame main body 11.

A substrate 50 is disposed on the frame main body 11. The substrate 50 includes substrate holes 50a corresponding respectively to the pins 13. The substrate holes 50a are formed through the substrate 50. When the substrate 50 is a flexible polymeric film, it can sag under gravity. The substrate 50 can further include a Light-to-Heat Conversion (LTHC) layer (not shown), which is disposed on a bottom surface of the substrate 50.

Also, inner pressing units 20 are disposed beside the outer side surfaces 11s of the frame main body 11. Each of the inner pressing units 20 includes pressing protrusions 21 respectively corresponding to the side holes 11b of the frame main body 11.

The substrate supporting frame "F" can further include a supporting plate 30 disposed over the frame main body 11.

Figure 3B:
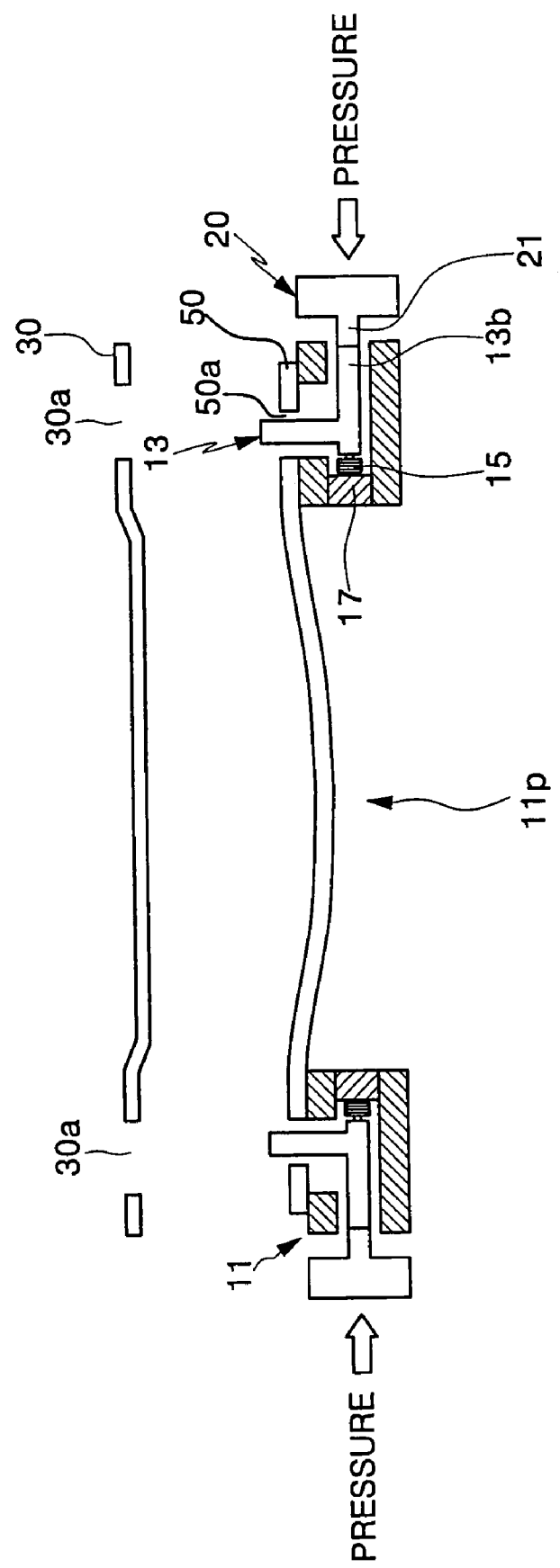

Referring to FIGS. 1, 2, and 3B, the inner pressing units 20 are moved toward the frame main body 11 and pressed. As a result, the pressing protrusions 21 are inserted into the side holes 11b and then press the pins 13 in an inward direction. Thus, the pins 13 move inward and compress the springs 15 attached to the pins 13. When the pins 13 include the lateral protrusions 13b, the pressing protrusions 21 can be formed to have a short length, and the pins 13 can be easily pressed in the inward direction.

Thereafter, the substrate 50 is moved downward so that the inwardly pressed pins 13 are respectively inserted into the substrate holes 50a. When the substrate holes 50a are formed through the substrate 50, the pins 13, which are inserted into the substrate holes 50a, protrude upward from the substrate 50.

Figure 3C:
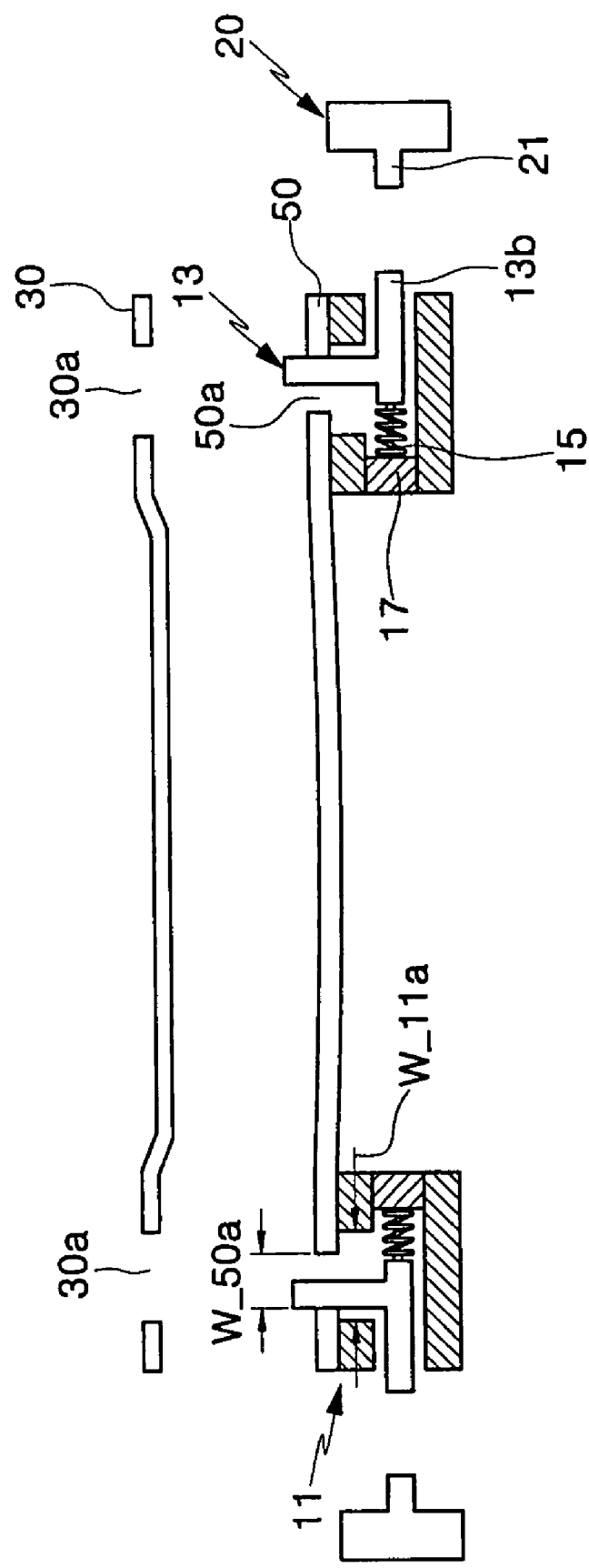

Referring to FIGS. 1, 2, and 3C, the inner pressing units 20 are removed from the frame main body 11. As a result, the compressed springs 15 are decompressed so that the pins 13 are pressed outward of the frame main body 11. Thus, the pins 13 move outward in the top holes 11a of the frame main body 11 and stretch the substrate 50 taut so that the substrate 50 is framed. Specifically, the pins 13 formed on one side of the top surface 11u and the other pins 13 formed on the other side of the top surface 11u move in opposite directions to each other so that the substrate 50 is stretched taut. As a result, the stretched taut substrate 50 does not sag but rather becomes tight. In order for the substrate 50 to be easily stretched taut by the pins 13, a width W_50a of the substrate hole 50a should be equal to or smaller than a width W_11a of the top hole 11a.

Assuming that the outer pressing units 15 are not springs, when an external force is not applied to the pins 13, the pins 13 cannot be disposed outward in the top holes 11a. Thus, the pins 13 cannot be pressed by the inner pressing units 20 to insert the pins 13 into the substrate holes 50a. Accordingly, when the outer pressing units 15 are not the springs, the pins 13 are inserted into the substrate holes 50a of the substrate 50 and then the pins 13 are pressed outward using the outer pressing units 15 so that the substrate 50 is stretched taut.

Figure 3D:
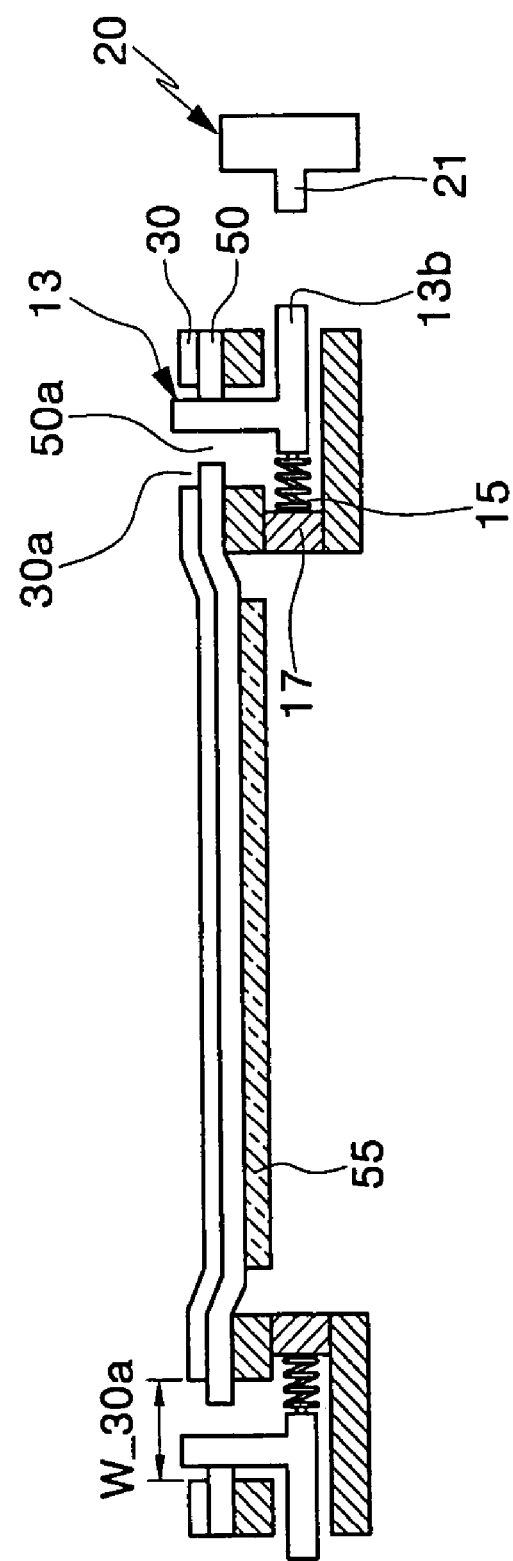

Referring to FIGS. 1, 2, and 3D, after the pins 13 are pressed by the outer pressing units 15, the supporting plate 30 is disposed on the stretched taut substrate 50. The supporting plate 30 is used to support the substrate 50.

The frame main body 11 can further include an adhesion unit 17, which closely adheres the supporting plate 30 to the substrate 50 and the frame main body 11. The supporting plate 50 can be a metal plate, and the adhesion unit 17 can be a magnet. Although the adhesion unit 17 is illustrated in the drawings as being disposed on the inner side surface 11t of the frame main body 11, the present invention is not limited thereto and the adhesion unit 17 can be disposed in any other appropriate position.

When the pins 13 protrude from the substrate 50, the supporting plate 30 include supporting holes 30a corresponding respectively to the pins 13. The supporting plate 30 is placed on the substrate 50 by inserting the pins 13 protruded from the substrate 50 into the supporting holes 30a. A width W_30a of the supporting hole 30a should be equal to or greater than the width W_11a of the top hole 11a. The motions of the pins 13 in the top holes 11a then cannot affect the supporting plate 30.

In the supporting plate 30, a portion 31_P1 corresponding to the opening 11a of the frame main body 11 protrudes downward from a portion 31_P2 corresponding to the top surface 11u of the frame main body 11. The supporting plate 30 pushes the substrate 50 downward so that the substrate 50 can be further stretched taut.

In this process, the substrate supporting frame "F", which includes the frame main body 11, the pins 13, the outer pressing units 15, and the supporting plate 30, as well as the substrate supporting frame assembly "Fa", which includes the substrate supporting frame "F" and the framed substrate 50, can be assembled.

FIGS. 4A, 4B and 4C are cross-sectional views of a method of fabricating a donor substrate and a method of fabricating an Organic Light Emitting Display (OLED) using the donor substrate according to an exemplary embodiment of the present invention.

Referring to FIG. 4A, a substrate supporting frame assembly "Fa" is prepared. Since the frame assembly "Fa" is the same as described with reference to FIGS. 1, 2, 3A, 3B, 3C and 3D, a detailed description thereof has been omitted.

The frame assembly "Fa" is loaded into a deposition system including a deposition source 70, and a transfer layer 55 is deposited on a substrate 50 in the deposition system. Specifically, the transfer layer 55 is formed on an LTHC layer (not shown) of the substrate 50. In this process, a donor substrate 57 is fabricated.

The transfer layer 55 can be deposited by an evaporation method. Specifically, a deposition material is evaporated from the deposition source 70 due to heat and accumulated on the substrate 50, thereby forming the transfer layer 55. The substrate 50 can be thermally deformed and sag down because of its increased surface area, but the substrate 50 can still remain stretched taut by pins 13 of the frame assembly "Fa". Accordingly, the transfer layer 55 can be uniformly formed on the substrate 50.

Also, when the frame assembly "Fa" further includes a supporting plate 30, the supporting plate 30 makes it easier to hold the substrate 50 stretched taut. Furthermore, when the supporting plate 30 is a highly thermal conductive metal plate, it prevents the substrate 50 from being partially thermally deformed. Thus, the transfer layer 55 can be formed more uniformly.

Referring to FIG. 4B, after the supporting plate (30 of FIG. 4A) is removed, the donor substrate 57 is disposed on an acceptor substrate 65 including at least a pixel electrode such that the transfer layer 55 faces the acceptor substrate 65. The acceptor substrate 65 can be fixed onto a chuck 60. Preferably, the chuck 60 is disposed inside an opening 11p of the frame main body 11.

Thereafter, the donor substrate 57 is laminated onto the acceptor substrate 65 using a roller 75.

Referring to FIG. 4C, a laser irradiation system 80 is disposed above the laminated donor substrate 57. The laser irradiation system 80 irradiates laser beams onto at least a portion of the donor substrate 57. The irradiated beams are absorbed into the LTHC layer of the donor substrate 57 and generate heat. The generated heat reduces adhesion between the LTHC layer and the transfer layer 55, thus transferring the transfer layer 55 onto the acceptor substrate 65. As a result, a transfer layer pattern 55a is formed on the acceptor substrate 65.

Figure 5:
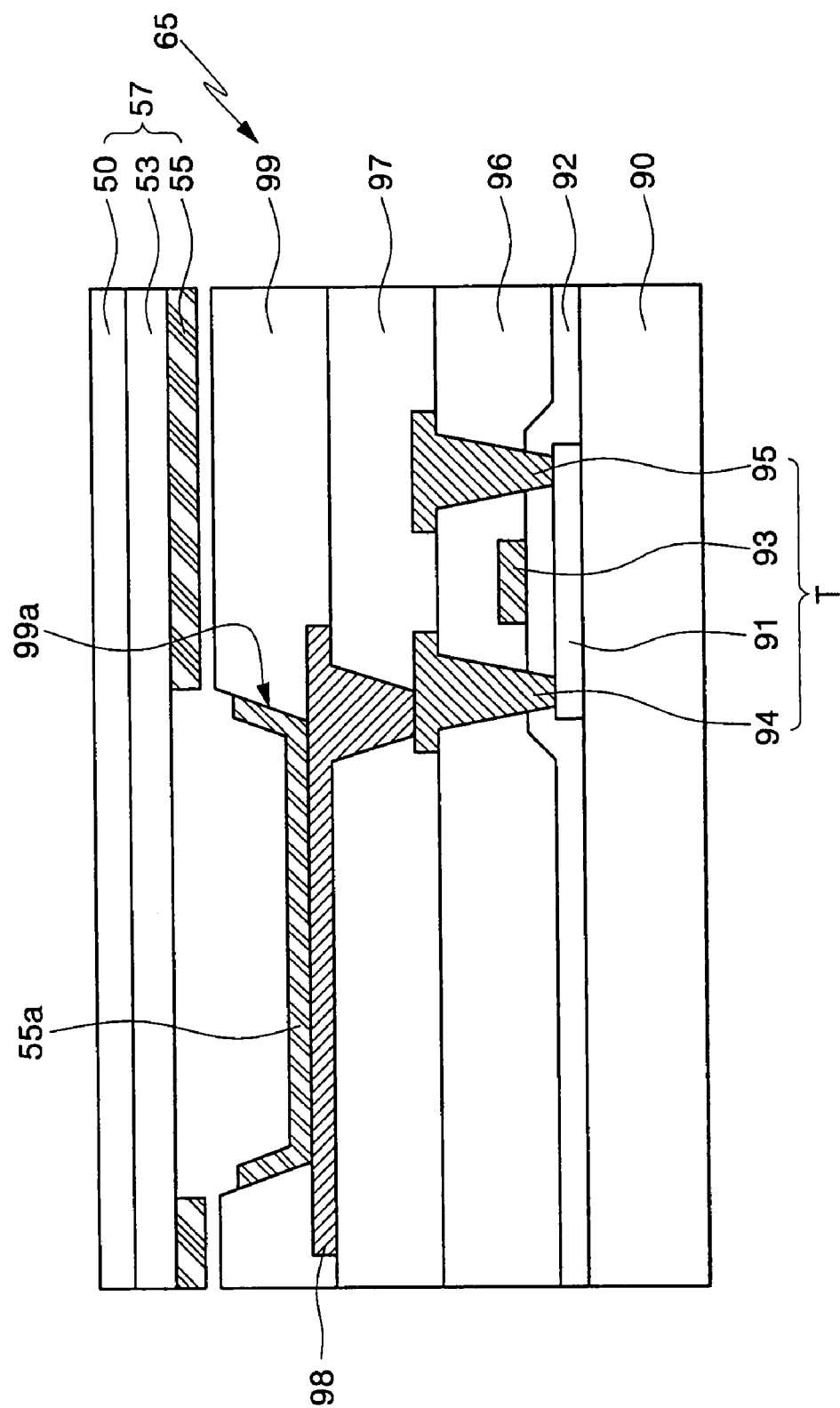
FIG. 5 is a magnified view of a portion of FIG. 4C.

FIG. 5 is a magnified view of a portion P of FIG. 4C, which shows both the acceptor substrate 65 and the donor substrate 57. In FIG. 5, the acceptor substrate 65 refers to a substrate for an organic light emitting device.

Referring to FIG. 5, the donor substrate 57 includes a substrate (i.e., a base substrate) 50, an LTHC layer 53 disposed on the base substrate 50, and a transfer layer 55 disposed on the LTHC layer 53.

In the acceptor substrate 65, a semiconductor layer 91 is disposed on a predetermined region of the substrate 90. The semiconductor layer 91 can be an amorphous silicon (a-Si) layer or a polysilicon (poly-Si) layer obtained by crystallizing the a-Si layer. A gate insulating layer 92 is disposed on the semiconductor layer 91. A gate electrode 93 is disposed on the gate insulating layer 92 such that it overlaps the semiconductor layer 91. A first interlayer insulating layer 96 is disposed on the gate electrode 93 to cover the semiconductor layer 91 and the gate electrode 93. A drain electrode 94 and a source electrode 95 are disposed on the first interlayer insulating layer 96. The drain and source electrodes 94 and 95 are connected to both edge portions of the semiconductor layer 91, respectively, through the first interlayer dielectric layer 96 and the gate insulating layer 92. The semiconductor layer 91, the gate electrode 93, and the drain and source electrodes 94 and 95 constitute a thin-film transistor "T". A second interlayer insulating layer 97 covers the drain and source electrodes 94 and 95. The second interlayer insulating layer 97 can include a passivation layer (not shown) for protecting the thin-film transistor "T" and/or a planarization layer (not shown) for reducing a step caused by the thin-film transistor "T". A pixel electrode 98 is disposed on the second interlayer insulating layer 97. The pixel electrode 98 is connected to the drain electrode 94 through the second interlayer insulating layer 97. The pixel electrode 98 can be, for example, an Indium Tin Oxide (ITO) layer or an Indium Zinc Oxide (IZO) layer. A pixel defining layer 99 is disposed on the pixel electrode 98. The pixel defining layer 99 includes an opening 99a, which exposes a portion of the pixel electrode 98.

A transfer layer pattern 55a, which is transferred from the donor substrate 57, is disposed on the exposed pixel electrode 98 inside the opening 99a. The transfer layer pattern 55a can be an emission layer. Also, the transfer layer pattern 55a can further include at least one layer selected from the group consisting of a hole injection layer, a hole transport layer, a hole blocking layer, an electron transport layer, and an electron injection layer.

According to the exemplary embodiments of the present invention as described above, a substrate supporting frame, which frames a substrate by stretching the substrate taut using a comparatively simple unit, can be obtained. Also, a substrate supporting frame assembly, in which the substrate is framed in the substrate supporting frame, can be fabricated. The substrate supporting frame assembly minimizes the thermal deformation of the substrate during the deposition of a transfer layer and enables a uniform transfer layer to be formed. In conclusion, a donor substrate with a uniform transfer layer can be fabricated using the substrate supporting frame assembly.

Although the present invention has been described with reference to certain exemplary embodiments thereof, it will be understood by those skilled in the art that a variety of modifications and variations can be made to the present invention without departing from the spirit or scope of the present invention defined in the appended claims.

What is claimed is:

1. A method of framing a substrate, comprising:
arranging a substrate supporting frame to include a main body having an opening, a plurality of pins protruding from at least two sides of a top surface of the main body, and outer pressing units adapted to respectively press the plurality of pins outward of the main body;
arranging a plurality of substrate holes on a substrate, the plurality of substrate holes respectively corresponding to the plurality of pins;
arranging the substrate on the main body;
respectively inserting the plurality of pins into the plurality of substrate holes; and
pressing the plurality of pins with the outer pressing units.

2. The method according to claim 1, further comprising arranging a plurality of top holes on the top surface of the main body, and respectively arranging the plurality of pins in the plurality of top holes.

3. The method according to claim 2, wherein each of the outer pressing units comprises a spring, and further comprising attaching one end of each spring to a respective one of the inner sidewalls of the plurality of top holes corresponding to an inner side surface of the main body, and attaching another end of each spring to a respective one of the plurality of pins.

4. The method according to claim 3, further comprising respectively pressing the plurality of pins inward of the main body with the inner pressing units before inserting the plurality of pins into the plurality of substrate holes, wherein pressing the plurality of pins with the outer pressing units comprises removing the inner pressing units from the main body.

5. The method according to claim 4, further comprising arranging a plurality of side holes, respectively connected to the plurality of top holes, in an outer side surface of the main body, and respectively pressing the plurality of pins through respective ones of the plurality of side holes with the inner pressing units.

6. The method according to claim 5, further comprising arranging a lateral protrusion on each of the plurality of pins, each lateral protrusion protruding through a respective side hole in a lateral direction of the main body, and pressing the lateral protrusions with the inner pressing units.

7. The method according to claim 1, further comprising disposing a supporting plate on the substrate after pressing the plurality of pins.

8. The method according to claim 7, further comprising arranging a plurality of supporting holes respectively corresponding to the plurality of pins in the supporting plate; wherein arranging the supporting plate comprises inserting the plurality of pins into the respective ones of the plurality of supporting holes.

9. A method of fabricating a donor substrate, comprising:
arranging a substrate supporting frame to include a main body having an opening, a plurality of pins protruding from at least two sides of a top surface of the main body, and outer pressing units adapted to respectively press the plurality of pins outward of the main body;
arranging a plurality of substrate holes on a substrate, the plurality of substrate holes respectively corresponding to the plurality of pins;
arranging the substrate on the main body;
arranging a Light-to-Heat Conversion (LTHC) layer on the substrate;
respectively inserting the plurality of pins into the plurality of substrate holes;
framing the substrate by pressing the plurality of pins with the outer pressing units; and
forming a transfer layer on the LTHC layer of the framed substrate.

10. The method according to claim 9, further comprising arranging a supporting plate on the substrate after pressing the plurality of pins.

11. The method according to claim 10, further comprising arranging a plurality of supporting holes, respectively corresponding to the plurality of pins, in the supporting plate; wherein arranging the supporting plate comprises respectively inserting the plurality of pins into the plurality of supporting holes.

12. The method according to claim 9, further comprising forming the transfer layer with an evaporation method.

13. A method of fabricating an Organic Light Emitting Display (OLED), comprising:
arranging a substrate supporting frame to include a main body having an opening, a plurality of pins protruding from at least two sides of a top surface of the main body, and outer pressing units adapted to respectively press the plurality of pins outward of the main body;
arranging a plurality of substrate holes on a substrate, the plurality of substrate holes respectively corresponding to the plurality of pins;
arranging the substrate on the main body;
arranging a Light-to-Heat Conversion (LTHC) layer on the substrate;
respectively inserting the plurality of pins into the plurality of substrate holes;
framing the substrate by pressing the plurality of pins with the outer pressing units;
fabricating a donor substrate by forming a transfer layer on the LTHC layer of the framed substrate;
arranging the donor substrate on an acceptor substrate including at least a pixel electrode such that the transfer layer faces the acceptor substrate; and
forming a transfer layer pattern by irradiating laser beams onto the donor substrate such that at least a portion of the transfer layer is transferred onto the pixel electrode.

14. The method according to claim 13, wherein the transfer layer pattern comprises an emission layer.

15. The method according to claim 14, wherein the transfer layer pattern further comprises at least one layer selected from a group consisting of a hole injection layer, a hole transport layer, a hole blocking layer, an electron transport layer, and an electron injection layer.

* * * * *